US011493560B2

(12) United States Patent
Faivre et al.

(10) Patent No.: US 11,493,560 B2
(45) Date of Patent: Nov. 8, 2022

(54) METHOD AND SYSTEM FOR DIAGNOSING THE OPERATING STATE OF AN ELECTROCHEMICAL SYSTEM IN REAL-TIME, AND ELECTROCHEMICAL SYSTEM INCORPORATING THIS DIAGNOSTIC SYSTEM

(71) Applicants: UNIVERSITE DE FRANCHE-COMTE, Besançon (FR); INSTITUT FRANCAIS DES SCIENCES ET TECHNOLOGIES DES TRANSPORTS, DE l'AMENAGEMENT ET DES RESEAUX, Champs sur Marne (FR)

(72) Inventors: Sébastien Faivre, Belfort (FR); Frédéric Gustin, Valdoie (FR); Daniel Hissel, Ronchamp (FR); Fabien Harel, Giromagny (FR); Zhongliang Li, Marseilles (FR)

(73) Assignees: UNIVERSITE DE FRANCHE-COMTE, Besançon (FR); INSTITUT FRANCAIS DES SCIENCES ET TECHNOLOGIES DES TRANSPORTS, DE l'AMENAGEMENT ET DES RESEAUX, Champs sur Marne (FR)

( * ) Notice: Subject to any disclaimer, the term of this patent is extended or adjusted under 35 U.S.C. 154(b) by 64 days.

(21) Appl. No.: 16/618,466

(22) PCT Filed: May 31, 2018

(86) PCT No.: PCT/EP2018/064346
§ 371 (c)(1),
(2) Date: Dec. 2, 2019

(87) PCT Pub. No.: WO2018/220115
PCT Pub. Date: Dec. 6, 2018

(65) Prior Publication Data
US 2021/0141024 A1    May 13, 2021

(30) Foreign Application Priority Data

Jun. 2, 2017    (FR) .................................... 1754949

(51) Int. Cl.
*G01R 31/3835* (2019.01)
*G01R 31/396* (2019.01)
*G01R 31/367* (2019.01)
*H01M 8/04537* (2016.01)

(52) U.S. Cl.
CPC ....... *G01R 31/3835* (2019.01); *G01R 31/367* (2019.01); *G01R 31/396* (2019.01); *H01M 8/04559* (2013.01)

(58) Field of Classification Search
None
See application file for complete search history.

(56) References Cited

U.S. PATENT DOCUMENTS 6,072,302 A * 6/2000 Underwood .............. H02J 3/40
                                                    322/17
2005/0084745 A1 * 4/2005 Colello ............. H01M 8/04679
                                                    700/297

(Continued)

FOREIGN PATENT DOCUMENTS

EP    2 778 700    9/2014
GB    2 527 584    12/2015

(Continued)

OTHER PUBLICATIONS

Pei-Yi Hao, A New Multi-class Support Vector Machine with Multi-sphere in the Feature Space, Jun. 29, 2007, (Year: 2007).*

(Continued)

*Primary Examiner* — Arleen M Vazquez
*Assistant Examiner* — Brandon J Becker
(74) *Attorney, Agent, or Firm* — Occhiuti & Rohlicek LLP

(57) ABSTRACT

A method for diagnosing the operating state of an electrochemical system in real-time comprising a stack of cells, said method comprising steps for performing voltage measurements of said cells. Said method further comprises:

(Continued)

real-time processing of the voltage measurements (61) thus performed, in order to extract specific waveforms (40) therefrom, converting said specific waveforms in order to generate specific points (65) therefrom of the real-time operation of the electrochemical system, and comparing these specific points of the real-time operation and specific points (75) of an off-line operation of the electrochemical system that originate from a conversion of specific waveforms (74) extracted from voltage measurements (78) performed off-line, while the electrochemical system is placed in known operating states including fault states, so as to produce information (69) relating to the real-time operating state of the electrochemical system.

20 Claims, 3 Drawing Sheets

(56) References Cited

U.S. PATENT DOCUMENTS

| | | | |
|---|---|---|---|
| 2011/0060538 A1* | 3/2011 | Fahimi | G01R 31/392 702/63 |
| 2014/0236509 A1* | 8/2014 | Kim | G01R 31/3835 702/63 |
| 2014/0278169 A1* | 9/2014 | Kim | G01R 31/367 702/63 |
| 2016/0093921 A1* | 3/2016 | Kadirvel | H02J 7/00 320/112 |
| 2016/0245873 A1* | 8/2016 | Lee | G06F 11/3003 |
| 2016/0311369 A1* | 10/2016 | Tabatowski-Bush | B60L 58/14 |
| 2017/0033783 A1* | 2/2017 | Rahman | H02H 3/00 |
| 2017/0123009 A1* | 5/2017 | You | B60L 58/16 |
| 2019/0157869 A1* | 5/2019 | Gadh | B60L 53/66 |

FOREIGN PATENT DOCUMENTS

| | | |
|---|---|---|
| WO | WO 02/27342 | 4/2002 |
| WO | WO 2015/101570 | 7/2015 |

OTHER PUBLICATIONS

Nadia Yousfi Steiner et al., "Non-Intrusive Diagnosis of Polymer Electrolyte Fuel Cells by Wavelet Packet Transform," International Journal of Hydrogen Energy, vol. 36, No. 1, pp. 740-746, Oct. 11, 2010.

* cited by examiner

# METHOD AND SYSTEM FOR DIAGNOSING THE OPERATING STATE OF AN ELECTROCHEMICAL SYSTEM IN REAL-TIME, AND ELECTROCHEMICAL SYSTEM INCORPORATING THIS DIAGNOSTIC SYSTEM

CROSS REFERENCE TO RELATED APPLICATION

This application is the national phase under 35 USC 371 of international application no. PCT/EP2018/064346, filed May 31, 2018, which claims the benefit of the Jun. 2, 2017 priority date of French application no. 1754949.

TECHNICAL FIELD

The present invention relates to a method for diagnosing the operating state of an electrochemical system in real-time. It also relates to a diagnostic system implementing this method, and an electrochemical system, in particular a fuel cell, incorporating this diagnostic system.

PRIOR ART

Current fuel cells, whether onboard or stationary, must be the subject of monitoring of their state, so as in particular to prevent a failure or degradation of their operation.

Methods for detecting faults in a fuel cell already exist, that can only be implemented when this cell is not operating and in a laboratory context. These methods sometimes implement intrusive sensors.

Furthermore, for fuel cells with high added value, used for example in an environment necessitating certain operation at all times, such as a hospital environment for example, detection methods involving temporary disconnection are not practicable.

The document EP 2778700 A2 discloses a unit for predicting the state of a battery pack, using discrete wavelet transforms.

The document "Non intrusive diagnosis of polymer electrolyte fuel cells by wavelet packet transform" from Nadia Yousfi Steiner et al., published in the International Journal of Hydrogen Energy, *Elsevier Science Publishers B.V., Barking GB*, vol. 36, No. 1, 11 Oct. 2010, pages 740-746, discloses a diagnostic method for cells of fuel cells with polymer fuels, implementing voltage measurements of batteries, and a wavelet packet transform.

The aim of the present invention is to propose a new method for detecting faults in an electrochemical system, in particular a fuel cell, that allows the state of this system in operation to be known and without any intrusive and/or complex or costly sensor, with higher performance, in terms of quality and reliability of the detection of the faults, than that usually observed in the present diagnostic methods.

DESCRIPTION OF THE INVENTION

This objective is achieved with a method for diagnosing the operating state of an electrochemical system in real-time comprising a stack of cells, said method comprising steps for performing voltage measurements of said cells, characterized in that it further comprises:

real-time processing of the voltage measurements thus performed, in order to extract specific waveforms therefrom, converting said specific waveforms in order to generate specific points therefrom of the real-time operation of said electrochemical system, and comparing said specific points of the real-time operation with specific points of an off-line operation of said electrochemical system that originate from a conversion of specific waveforms extracted from voltage measurements performed off-line, while said electrochemical system is placed in known operating states including fault states, so as to produce information relating to the real-time operation of said electrochemical system.

The cell voltage measurement steps can be performed periodically.

In a preferred embodiment of the invention, the specific waveforms extracted from the voltage measurements performed off-line and/or in real-time are subjected to a mathematical transformation called "shapelet transform" in order to create specific points from specific waveforms.

These specific points can be identified in a two-dimensional (2D) space, then classified in a three-dimensional (3D) space.

In a first particular embodiment of the method according to the invention, specific points are classified by means of a Sphere Shaped Multi-Class-Support Vector Machine (SSM-SVM) type function.

In a second particular embodiment of the method according to the invention, specific points are classified by means of a K Nearest Neighbor (kNN) type function.

In a third particular embodiment of the method according to the invention, specific points are classified by means of a Gaussian Mixture Model (GMM) type function.

The diagnostic method according to the invention can furthermore advantageously comprise an initial establishment of a database through learning of the known operating states of the electrochemical system that are tested off-line.

When the method according to the invention is implemented in order to diagnose the operating state of a fuel cell, the known operating states that are tested off-line comprise all or some of the following states: normal operation, low hydrogen pressure, low stoichiometry on the air side, drying, flooding.

According to another aspect of the invention, a system is proposed for diagnosing the operating state of an electrochemical system in real-time comprising a stack of cells, implementing the diagnostic method according to the invention, this diagnostic system comprising means for measuring the voltage values at the terminals of said cells, characterized in that it further comprises:

means for processing the voltage values thus measured in order to extract specific waveforms therefrom, means for converting said specific wave functions in order to generate specific points of the real-time operation of said electrochemical system therefrom, and means for comparing said specific points of real-time operation and specific points of an off-line operation of said electrochemical system that originate from a conversion of specific waveforms extracted from voltage measurements performed off-line—while said electrochemical system is placed in known operating states including fault states, so as to produce diagnostic information relating to the real-time operating state of said electrochemical system.

The diagnostic system according to the invention can furthermore advantageously comprise means for converting the specific waveforms extracted from the voltage measurements performed off-line and/or in real-time, so as to create specific points.

This diagnostic system can furthermore comprise means for identifying the specific points in a two-dimensional (2D) space and means for classifying said specific points thus identified in a three-dimensional (3D) space, and a database through learning of known operating states of the electrochemical system.

According to yet another aspect of the invention, an electrochemical system is proposed that incorporates a diagnostic system according to the invention. This electrochemical system can in particular include a fuel cell.

DESCRIPTION OF THE FIGURES

Other advantages and particularities of the invention will emerge on reading the detailed description of in no way limitative implementations and embodiments, and of the following attached drawings.

EMBODIMENTS IN DETAIL

Since these embodiments are in no way limitative, it will in particular be possible to consider variants of the invention comprising only one choice of characteristics described or illustrated subsequently, isolated from the other characteristics described or illustrated (even if this choice is isolated within a phase comprising these other characteristics), if this choice of characteristics is sufficient to confer a technical advantage or to differentiate the invention with respect to the prior art. This choice comprises at least one characteristic of functional preference without structural details, and/or with only a part of the structural details if this part alone is sufficient to confer a technical advantage or to differentiate the invention with respect to the prior art.

Figure 1:
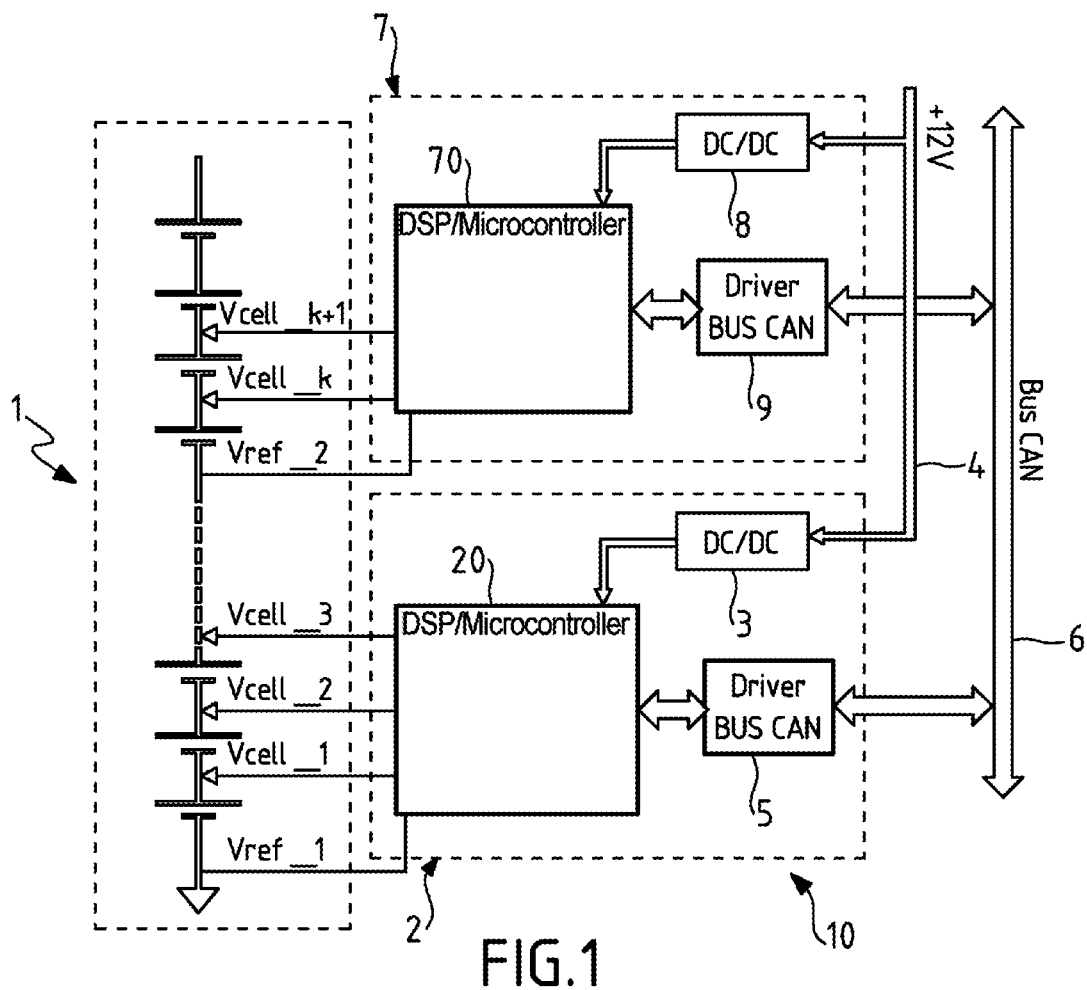
FIG. 1 schematically illustrates the voltage measurement principle implemented in the fault detection method according to the invention.

First to be described, in reference to FIG. 1, is a device 10 for measuring voltage at the terminals of the different cells of an electrochemical system 1 such as a battery, an ultracapacitor or a fuel cell.

The different voltage values Vcell 1, . . . , k+1 are measured then processed by programmable components of the Digital Signal Processor (DSP) or microcontroller 20, 70 type and the data are transmitted by a communication CAN bus 6.

The measurement device 10 has a modular form. Each electrically insulated module 2, 7 is responsible for measuring the voltage values Vcell_1,Vcell_2,Vcell_3; Vcell_k, Vcell_k+1 of a number of cells, respecting the order defined by the connection in series of same. It is therefore possible to connect as many modules 2, 7 as necessary to meet the needs of the user, the limit being fixed by the level of voltage insulation of the electronic components (approximately 1000V in the most critical case).

Each measurement module 2, 7 includes an electronic circuit based around a microcontroller 20, 70, its reference potential (ground) corresponding to the lowest potential of the package of elements (Vref_1, Vref_2). These modules 2, 7 are powered by means of an insulated DC/DC converter 3, 8, connected to the general power supply of the device 10. The different data that originate from the measurements are transmitted by means of a communication bus. For this to happen, insulated CAN drivers 5, 9 allow connections between the microcontrollers 20, 70 and the CAN bus 6 of the measurement device 10.

The measurement modules 2, 7 are duplicated as many times as necessary in order to measure the different voltage values at the terminals of all of the elements of the studied electrochemical system 1.

Figure 2:
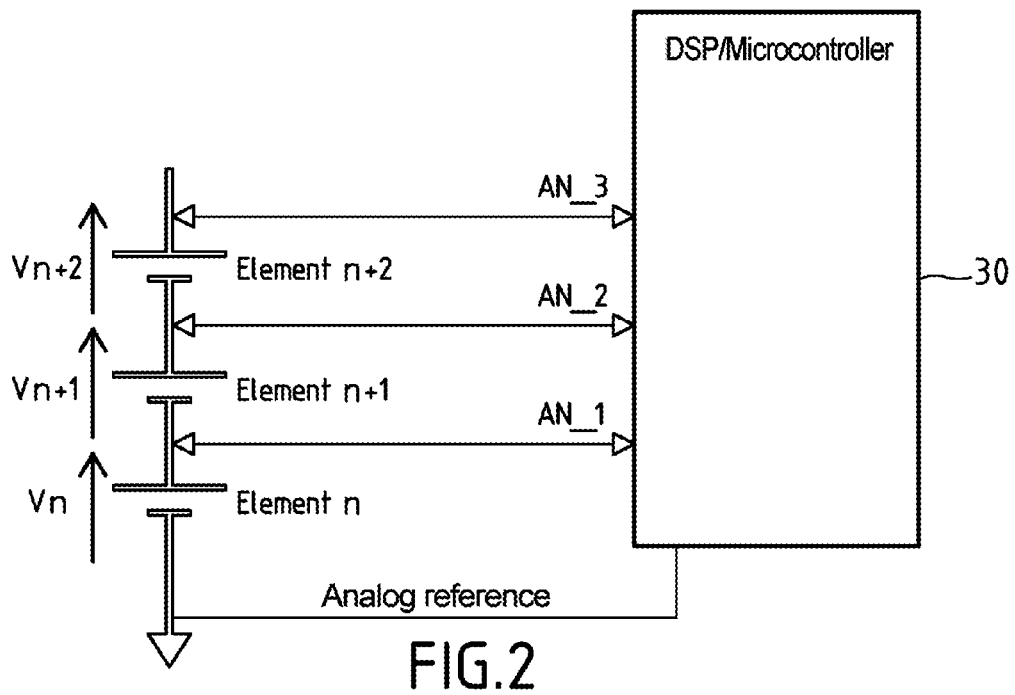
FIG. 2 schematically illustrates an implementation of a microcontroller for analog measurements.

In reference to FIG. 2, the reference potential of the analog measurements of the microcontroller 30 is connected to the lowest voltage of the set of the elements concerned n, n+1, n+2. The different voltage measurements Vn, Vn+1, Vn+2 are connected to the analog inputs AN_1, AN_2, AN_3 of the microcontroller 30, respecting the order established by the potentials: from the weakest to the strongest. The voltage at the terminals of an element is then determined by the difference between two measured consecutive voltage values.

Depending on the measured voltage levels, the analog inputs of the microcontroller 30 can be connected directly to the elements to be measured. For higher voltage values, an adaptation circuit allows the voltage to be adjusted within a range compatible with that of the microcontroller.

Depending on the microcontroller or DSP circuit used, the number of analog channels is variable and thus limits the number of voltage values measured on a subset of cells. The analog measurements can be performed simultaneously (synchronous measurements) or sequentially (asynchronous measurements).

Figure 3:
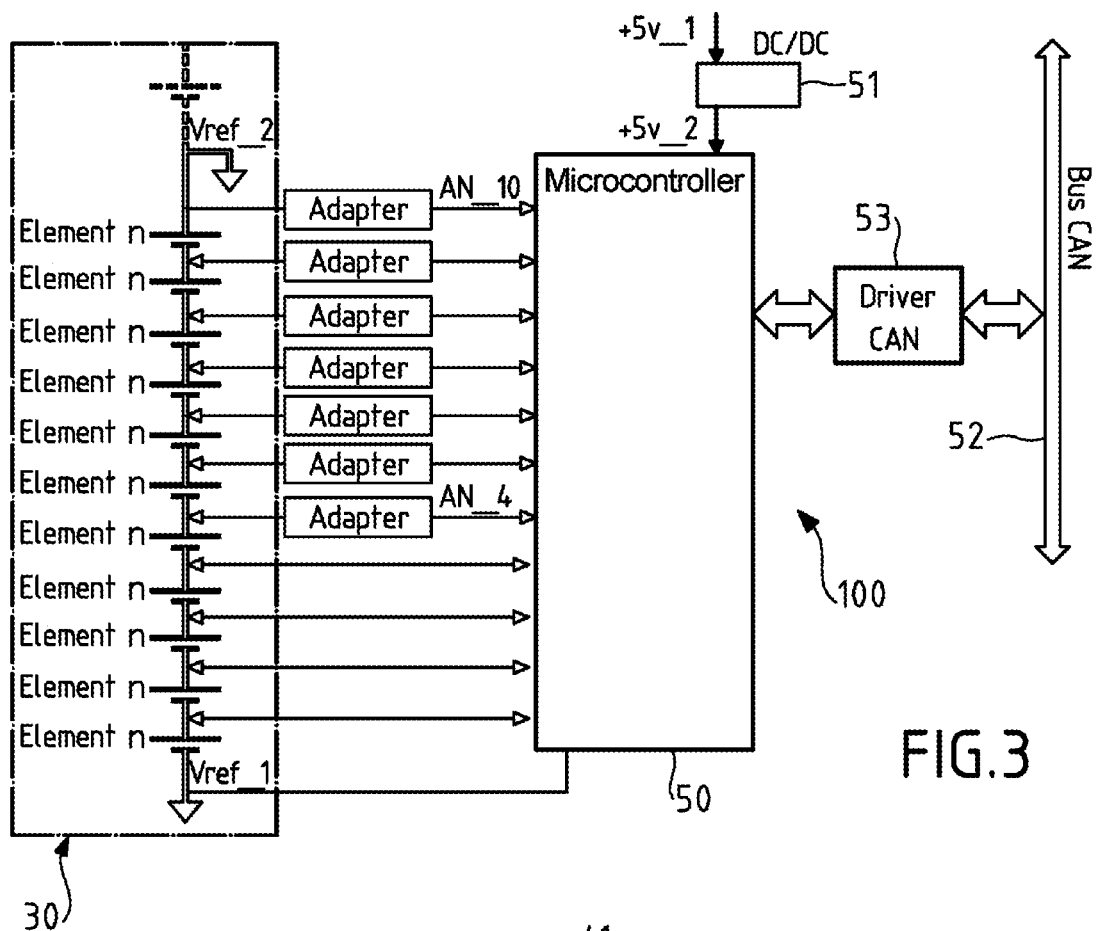
FIG. 3 illustrates a voltage measurement device implemented in an embodiment example of a fault detection system according to the invention.

In the embodiment example illustrated by FIG. 3, the measurement device 100 is used to measure the voltage values of the cells of a fuel cell 30. In practice, the voltage of the cells can reach approximately 1.43V when they are activated, but the useful measurement range is between 0 and 1V.

The measurement device 100 comprises a microcontroller 50 including 11 analog inputs and a single incorporated analog to digital converter. The principle of sequential measurements is then used for the different analog channels. The overall conversion time for the 11 channels remains less than 2 ms (150 μs per channel, namely 1.6 ms).

The different voltage values of the cells of the fuel cell 40 are connected to the analog inputs, directly for the first four channels (voltage values less than 4V), and by means of an adaptation circuit for channels AN_4 to AN_10.

The measurement device 100 is powered from a voltage source of 5V DC (+5V_1). A DC/DC converter 51 allows an insulated voltage of 5V (+5V_2) to be obtained to power all the electronics. The circuit used provides an insulation voltage of 1000V. The whole of the measurement device 100 is thus insulated with a reference potential Vref_1.

In order to provide this insulation, communications between the microcontroller 50 and the rest of the system are provided by a CAN bus 52, also insulated. A CAN driver circuit 53 insulates the microcontroller 50 by providing an insulation voltage of 2500V.

Figure 4:
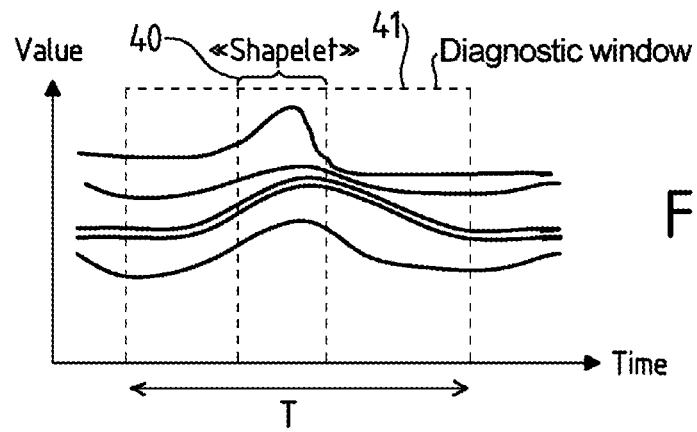
FIG. 4 illustrates specific waveforms (or "shapelets") produced in the diagnostic detection method according to the invention.
Figure 5:
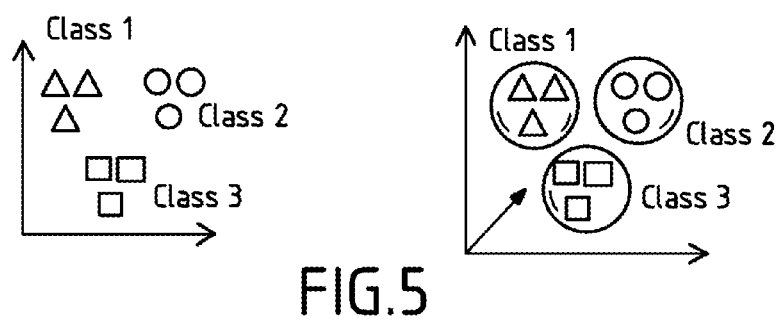
FIG. 5 illustrates a classification of the specific waveforms with the SSM-SVM method.
Figure 6:
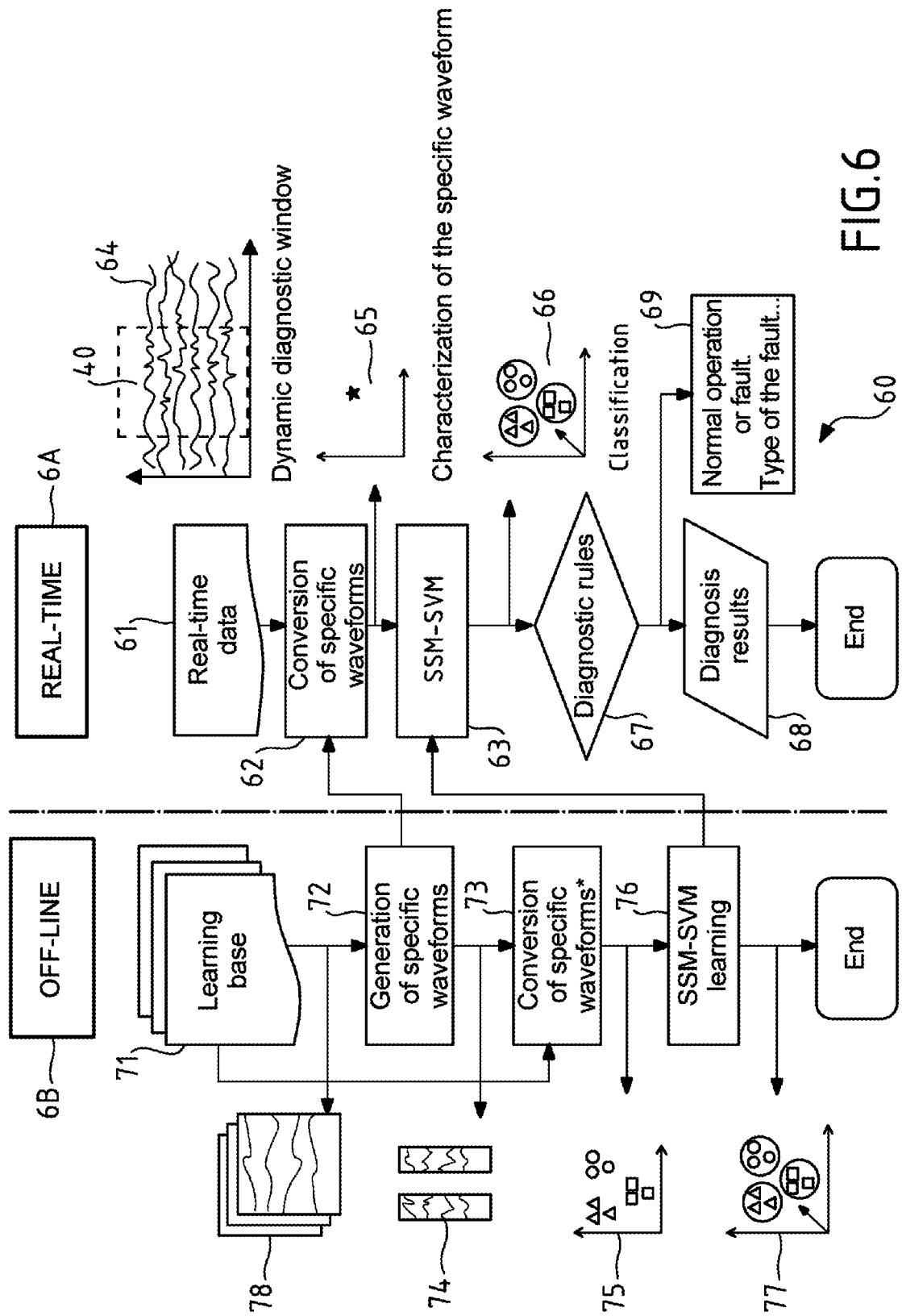
FIG. 6 schematically illustrates an embodiment example of the diagnostic method according to the invention.

Now to be described, with reference to FIGS. 4 to 6, are the processing steps that are implemented in the diagnostic method according to the invention.

The diagnostic method according to the invention is constructed around learning based on measured and known data. Here it is implemented in the aim of detecting faults of a fuel cell system of the Polymer Electrolyte Membrane Fuel Cell type (PEMFC). It is understood that the diagnostic method according to the invention can be implemented without limitation in other types of fuel cell.

This diagnostic method implements a device for measuring individual voltage values of unitary cells of the fuel cell such as described previously. In order to take account of the dynamics of the system and the spatial heterogeneity of the different cells it consists of, the diagnostic method according to the invention calls upon a time series analysis tool, hereinafter called "shapelet transform", which characterizes specific waveforms extracted from the voltage measurements performed at the terminals of the cells of the electrochemical system.

In reference to FIG. 6, in a particular embodiment form of the diagnostic method according to the invention, the method comprises a process 6A of processing voltage measurements performed on the cells of the battery in real-time, and a process 6B of off-line processing of voltage measurements performed on the same cells but in known operating states including states of malfunctioning.

The time analysis tool is used for extracting specific waveforms or "shapelets" 40 (FIG. 4) that originate from the data of a database 61 (FIG. 6) used for real-time diagnostics. The time analysis tool is used in a window 41 whose duration is known and defined beforehand according to the considered faults. In a second time, an SSM-SVM classification tool is applied in the considered dimensional space (according to the number of faults).

The voltages of the cells of the fuel cell are by nature not homogeneous due to their physical states within a battery (or "stack") such as the temperature, the gas distribution, the relative humidity, the distribution of the catalyst on the activation layer, and the time correlation between the measured samples must be considered. The voltages of cells sampled in a time interval (window 41) are considered as variables for the diagnostic method according to the invention.

This acquisition window is mathematically defined as follows:

$$T=[T(1), \ldots, T(l_w)]=[v_1, \ldots, v_{l_w}] \quad (1)$$

where $v_i$ is the vector sampled at the index i and consists of all the voltage values of a number $n_{cell}$ of cells.

This vector $v_i=[v_i(1), v_i(2), \ldots, v_i(n_{cell})]$. $l_w$ is the width of the acquisition window.

Each observation T is a dynamic chronological series that can be mathematically represented in the shape of a matrix, whose size is defined on one hand by the number of cells and on the other by the duration of the observation $l_w$ and whose number of points is defined by the sampling period (or acquisition frequency) of the measurement device.

In the off-line process 6B, a learning database 71 is established from N off-line measurements obtained by means of the measurement device described previously. It is classified by graded classes $\Omega 0, \Omega 1, \Omega 2, \ldots, \Omega C$, which correspond to the different faults. The index class 0 is defined as the normal operating state (without faults).

The spacing of the classes over the set of the observations $T_i$ is known beforehand, namely $g_i \in \{0, 1, \ldots, C\}$. The numbers of observations 78 that constitute the database 71 in all of these classes are respectively $N_0, N_1, \ldots N_C$ and satisfy the equation N0+N1+ . . . +NC=N.

The generation of specific waveforms ("shapelets") in the two processes, real-time 6A and off-line 6B, will now be more particularly described.

In order to identify a specific waveform, it is necessary to produce a quantity of eligible signals that are called candidates and that are generated in the vector $SC_{ji}$.

Assuming that the specific waveform has a duration $l_s$, the candidates are selected taking account of the observation time $l_w$. For example, the candidates are considered up to $l_w-l_s+1$ for an observation $T_i$ according to the formula below:

$$SC_{ji}=\{T_i(j),T_i(j+1), \ldots ,T_i(j+l_s-1)\}, j=1, \ldots ,l_w-l_s+1 \quad (2)$$

where $SC_{ji}$ represents the number j candidate of the matrix $T_i$. As $SC_{ji}$ originates from $T_i$, the space in which it is situated is also $g_i$. The number of candidates generated from the learning base 71 is therefore $(l_w-l_s+1)N$.

In this method, the times $l_s$ and $l_w$ are defined beforehand for each class. This definition is empirically obtained when establishing the learning database.

In order to be able to classify and characterize the candidates, three operations are required. The first consists of calculating the distance between a candidate $SC_{ij}$ and the observation Tk, which is equal to the minimum value between the candidate $SC_{ij}$ and all of the candidates generated by this observation Tk as follows:

$$dis(SC_{i,j}, T_k) = \min_{l \in (1, \ldots l_w-l_s+1,)} \|SC_{i,j} - SC_{k,l}\| \quad (3)$$

This distance is calculated for each candidate, then the mean distance of this same class is also defined.

$$\overline{dis}(SC_{i,j}) = \frac{\sum_{gk=gi} dis(SC_{i,j}, T_k)}{N_i} \quad (4)$$

The two above values serve to calculate the quality factor of each candidate of a same class according to the following quadratic discrimination formula:

$$Qual(SC_{i,j}) = \frac{\sum_{gk \neq gi} dis(SC_{i,j}, T_k)^2}{\sum_{gk=gi} \left(dis(SC_{i,j}, T_k) - \overline{dis}(SC_{i,j})\right)^2} \quad (5)$$

When all of the candidates of each class have been evaluated, they are classified by decreasing order according to their quality factors. In the case where two candidate specific waveforms of the same observation base obtain redundant indices, then it is the one having the highest quality factor that is retained. Of the remaining candidates, it is those having the best quality factors that are selected.

The procedure for extracting specific waveforms that has just been described can easily be implemented in the form of an algorithm with known software technology. Specific waveforms 74 can thus be generated in the off-line process 6B and specific waveforms 40 in the real-time process 6A.

An example will now be more particularly described of extracting specific waveforms during a real-time diagnosis. For a diagnostic window T (FIG. 4) taken arbitrarily, the characteristics of the specific waveforms of this arbitrary base that originates from real-time measurements 64 (see FIG. 6) are determined by calculating the distance with those that originate from the learning base 71 and are selected as pertinent.

This calculation also allows the size of the characterization field to be known, which will be used to initialize the SSM-SVM classification tool 63 in reference to FIG. 6.

An example will now be described of implementation of this SSM-SVM classification tool in the diagnostic method according to the invention.

In order to solve the problem of non-linear classification that originates from the learning data (due in particular to the fact that more than two classes are considered), the method used below is known as the "kernel trick".

In a first period, a projection of vectors into a multidimensional space is performed through the function $\psi$.

The vectors are defined as follows: $z_n (n \in T)$

For example, for a class i, the sphere is calculated as follows:

$$\begin{cases} \|\Phi(z_n) - a_i\|^2 \leq R_i^2 + \xi_n^i & \text{if } z_n \in \Omega_i \\ \|\Phi(z_n) - a_i\|^2 \geq R_i^2 - \xi_n^i & \text{if } z_n \notin \Omega_i \end{cases} \quad (6)$$

Where $R_i$ and $a_i$ are respectively the radius and the center of the circle of the sphere i.

The function $\phi$ used is the Gaussian core, namely:

$$k(z_m, z_n) = \exp\left(-\frac{\|z_m - z_n\|^2}{2\sigma^2}\right) \quad (7)$$

The SSM-SVM classification amounts to solving the following optimization problem:

$$\min_{R_i, a_i} \left( R_i^2 + D \sum_{n \in \mathcal{T}} \xi_n^i \right) \quad (8)$$

$$\text{s.t.} \begin{cases} c_n^i(\|\Phi(z_n) - a_i\|^2 - R_i^2) - \xi_n^i \leq 0 \\ \xi_n^i \geq 0 \end{cases} \text{ for } n \in \mathcal{T}$$

For a given index i, the sum of the square of the radius $R_i$ and of the sum of the adjustment variables multiplied by an adjustment parameter D allowing correct adjustment during the learning phase are minimized, with the following constraints:
- the square of the absolute distance between the function applied to the support vector zn and the center of the sphere minus the square of the radius minus the adjustment variable must be less than or equal to zero,
- the adjustment variables are greater than or equal to zero. Considering $c_n^i = 1$ if $z_n \in \Omega_i$; $c_n^i = -1$ if $z_n \notin \Omega_i$ The solution to the optimization problem (8) is given by:

$$L = \Sigma_i R_i^2 + D\Sigma_{n,i}\xi_n^{in} - \Sigma_{n,i}\beta_n^i + \Sigma_{n,i}\alpha_n^i(c_n^i(\|\phi(z_n) - \alpha_i\|^2 - R_i^2) - \xi_i^n) \quad (9)$$

In the equation (9), the two non-negative Lagrange multipliers $\alpha_n^i$ and $\beta_n^i$, are found. They are associated with the constraints described in (8). In order to solve the optimization problem, the extremum of L must therefore be found.

$$\frac{\partial L}{\partial R_i} = 0 \rightarrow \Sigma_n \alpha_n^i c_n^i = 1 \quad (10)$$

-continued $$\frac{\partial L}{\partial a_i} = 0 \rightarrow a_i = \Sigma_n \alpha_n^i c_n^i \phi(z_n) \quad (11)$$

$$\frac{\partial L}{\partial \xi_n^i} = 0 \rightarrow \alpha_n^i + \beta_n^i - D \text{ et } 0 \leq \alpha_n^i \leq D \quad (12)$$

The radius of the sphere i, $R_i$ can be calculated after the Karush-Kuhn-Tucker conditions (KKT conditions) described below.

$$\alpha_n^i(c_n^i(\|\phi(z_n) - \alpha_i\|^2 - R_i^2) - \xi_n^i) = 0$$

$$(D - \alpha_n^i)\xi_n^i = 0$$

Hence $$R_i^2 = \|\phi(z_n) - \alpha_i\|^2 \text{ for all the } zn \text{ with } \alpha_n^i \in (0, D)$$

The SSM-SVM algorithm can be encoded on the basis of these analytical calculations. In the implementation example described here, operation takes place on a number of classes of more than 2 and in a space of sizes larger than 2.

This algorithm allows the quadratic problem to be broken down into a sum of linear problems that are dealt with one by one. Each Lagrange multiplier is calculated individually and the support vectors describing the spheres encompassing the classes are updated at each iteration.

The SSM-SVM method that has just been described thus allows specific waveforms to be classified, in reference to FIG. 5. Furthermore, the association of the specific waveforms (or "shapelets") with the SSM-SVM classification allows better performance in terms of error rates than that usually observed with the current diagnostic methods.

Using the SSM-SVM method makes it possible to obtain at the same time results of classification 77 of the specific waveforms 75 that originate from off-line observations in a learning mode, and results of classification 66 of the specific waveforms 65 that originate from voltage measurements performed in real-time.

The classification results that originate from the SSM-SVM learning mode 76 are used in the SSM-SVM 63 processing of the specific points that originate from the conversion 62 of the specific waveforms that originate from the real-time measurements.

A real-time diagnostic strategy implemented in the diagnostic method according to the invention will now be described in reference to FIG. 6. The voltage values at the terminals of the cells of the electrochemical system are measured by means of the measurement device previously described in reference to FIGS. 1 to 3. These measurements are digitized at a sampling frequency of 1 hz for a time Lw then saved as a real-time data table 61 that will subsequently be used for the calculations.

The real-time data are acquired along a sliding acquisition window. Once the table is saved, the minimum distances are then calculated in specific waveform through the conversion 62.

When the specific waveform is characterized and graphically represented by a specific point 65, it is then analyzed by the SSM-SVM algorithm 63, which will allocate a class to it according to its position in the volumes defined by the spheres, as illustrated in FIG. 5. Each class is associated with an operating state (normal or describing a known fault).

Diagnostic rules 67 are then applied to the results of classification 66 so as to generate results of the diagnosis 68 that will allow an operating diagnosis 69 to be set down (normal or fault, type of fault, . . . ), which will be communicated to the management of the electrochemical system and possibly to the user or to the personnel responsible for maintaining the system. These operations are repeated over and over at each new acquisition (window) and this at each start-up of the system.

It should be noted that other mathematical methods, in particular calling upon networks of neurons or of the K Nearest Neighbor (kNN) or Gaussian Mixture Model (GMM) type, could be used to perform classifications of specific waveforms.

Of course, the invention is not limited to the examples that have just been described and many modifications can be made to these examples without departing from the framework of the invention. The different characteristics, forms, variants and embodiments of the invention can naturally be associated with each other according to various combinations to the extent that they are not mutually incompatible or exclusive. In particular, all the variants and embodiments described previously can be combined.

The invention claimed is:

1. A method for diagnosing an operating state of an electrochemical system in real-time, said electrochemical system comprising a stack of cells, said method comprising
performing voltage measurements at terminals of said cells that form said stack of cells,
real-time processing of the voltage measurements thus performed in order to extract specific waveforms therefrom, said waveforms being indicative of real-time operation of said electrochemical system,
subjecting said specific waveforms to a shapelet transform, thereby generating first specific points therefrom, wherein said first specific points are indicative of the real-time operation of said electrochemical system, and
comparing said first specific points with second specific points, wherein said second specific points are indicative of off-line operation of said electrochemical system,
wherein said second specific points originate from a conversion of specific waveforms extracted from voltage measurements performed off-line while said electrochemical system is placed in known operating states, including fault states, so as to produce information relating to the real-time operation of said electrochemical system.

2. The method as claimed in claim 1, wherein performing the voltage measurements at the terminals of each of the cells comprises performing the voltage measurements periodically.

3. The method as claimed in claim 1, further comprising calculating a minimum distance between selected specific waveforms and said specific waveforms extracted from the voltage measurements, wherein said selected specific waveforms are waveforms that characterize known operating states.

4. The method as claimed in claim 1, further comprising identifying the first specific points and/or the second specific points in a two-dimensional space and classifying the first specific points and/or the second specific points in a three-dimensional space.

5. The method as claimed in claim 4, wherein classifying the first specific points and/or the second specific points comprises classifying by means of a Sphere-Shaped Multi-Class-Support Vector Machine type function.

6. The method as claimed in claim 4, wherein classifying the first specific points and/or the second specific points comprises classifying by means of a K-Nearest Neighbor type function.

7. The method as claimed in claim 4, wherein classifying the first specific points and/or the second specific points comprises classifying by means of a Gaussian Mixture Model type function.

8. The method as claimed in claim 1, further comprising initially establishing a database through learning of the known operating states of the electrochemical system that are tested off-line.

9. The method as claimed in claim 1, further comprising diagnosing an operating state of a fuel cell, wherein the operating state that is tested off-line comprises a high-pressure state.

10. An apparatus comprising a diagnostic system for diagnosing the operating state of an electrochemical system in real-time, wherein said electrochemical system comprises a stack of cells, said apparatus comprising
means for measuring voltage values at terminals of each of said cells that form said stack of cells,
means for processing the voltage values thus measured in order to extract specific waveforms therefrom, said specific waveforms being indicative of real-time operation of said electrochemical system,
means for subjecting said specific waveforms to a shapelet transform, thereby generating first specific points being points of the real-time operation of said electrochemical system therefrom, and
means for comparing said first specific points and second specific points, said second specific points being points of an off-line operation of said electrochemical system,
wherein said second specific points originate from a conversion of specific waveforms extracted from voltage measurements performed off-line while said electrochemical system is placed in known operating states, including fault states, so as to extract information relating to a real-time operating state of said electrochemical system.

11. The apparatus of claim 10, wherein said diagnostic system further comprises means for converting the specific waveforms extracted from the voltage measurements performed off-line so as to create the second specific points.

12. The apparatus of claim 10, wherein said diagnostic system further comprises means for identifying the first specific points in a two-dimensional space and means for classifying said first specific points thus identified in a three-dimensional space.

13. The apparatus of claim 10, wherein said diagnostic system further comprises a database of known operating states of said electrochemical system.

14. The apparatus of claim 10, further comprising an electronic system that comprises said stack of cells and said diagnostic system.

15. The apparatus of claim 14, wherein said stack of cells includes a fuel cell.

16. The method of claim 1, further comprising calculating a minimum distance between selected specific waveforms and said specific waveforms extracted from the voltage measurements, wherein said selected specific waveforms are waveforms that characterize known operating states, wherein said selected specific waveforms are obtained by carrying out a processing step in an off-line state, wherein said processing step comprises processing voltage measurements that were performed off-line while said electrochemical system was placed in known operating states to extract specific waveforms, said extracted specific waveforms being candidates, wherein said known operating states include fault states, wherein said method further comprises, for each of said candidates, calculating a minimum distance between said candidate all of said extracted specific waveforms and calculating a quality factor function for said minimum distance, selecting candidates having the best quality factors, the selected specific waveforms being said selected candidates.

17. The method as claimed in claim 1, further comprising diagnosing an operating state of a fuel cell, wherein the operating state that is tested off-line comprises low hydrogen pressure.

18. The method as claimed in claim 1, further comprising diagnosing an operating state of a fuel cell, wherein the operating state that is tested off-line comprises low stoichiometry on an air side.

19. The method as claimed in claim 1, further comprising diagnosing an operating state of a fuel cell, wherein the operating state that is tested off-line comprises a drying state.

20. The method as claimed in claim 1, further comprising diagnosing an operating state of a fuel cell, wherein the operating state that is tested off-line comprises a flooding state.

\* \* \* \* \*